(12) United States Patent
Chuang (10) Patent No.: US 10,972,093 B2
(45) Date of Patent: Apr. 6, 2021

(54) AUXILIARY CIRCUIT AND POWER CONVERTER

(71) Applicant: DELTA ELECTRONICS, INC., Taoyuan (TW)

(72) Inventor: Po-Chin Chuang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 103 days.

(21) Appl. No.: 16/226,673

(22) Filed: Dec. 20, 2018

(65) Prior Publication Data

US 2019/0238128 A1 Aug. 1, 2019

Related U.S. Application Data

(60) Provisional application No. 62/623,746, filed on Jan. 30, 2018.

(51) Int. Cl.
*H03K 17/687* (2006.01)
*H02M 3/335* (2006.01)
(Continued)

(52) U.S. Cl.
CPC .......... *H03K 17/6871* (2013.01); *H02M 1/08* (2013.01); *H02M 1/32* (2013.01);
(Continued)

(58) Field of Classification Search
CPC ......... H02M 2001/0058; H02M 3/158; H02M 1/08; H02M 1/32; H02M 1/083; H02M 1/36; H02M 2001/007; H02M 1/34; H02M 2001/0048; H02M 3/33507; H02M 1/088; H02M 1/4225; H02M 1/4258; H02M 2001/0006; H02M 2001/0009; H02M 2001/008; H02M 3/155; H02M 3/33546; H02M 3/33569; H02M 3/33584; H02M 7/003; H02M 2001/003; H02M 2001/0032; H02M 2003/1566; H02M 3/1582; H02M 3/335; H02M 3/3353; H02M 3/33576; H02M 3/3376; H02M 7/04; H02M 7/06;
(Continued)

(56) References Cited

U.S. PATENT DOCUMENTS

| 5,514,996 A | 5/1996 | Aizawa |
| 7,907,001 B2 | 3/2011 | Mazzola et al. |

(Continued)

FOREIGN PATENT DOCUMENTS

| CN | 101399503 A | 4/2009 |
| CN | 201893694 U | 7/2011 |

(Continued)

*Primary Examiner* — Vinh P Nguyen
(74) *Attorney, Agent, or Firm* — CKC & Partners Co., LLC (57) ABSTRACT

An auxiliary circuit for outputting a supplying voltage or a detection signal includes a normally-on device and a signal processing circuit. A drain terminal of the normally-on switching device is coupled to a first terminal, a gate terminal of the normally-on switching device is coupled to a second terminal. An input voltage between the first terminal and the second terminal switches between two different levels. The signal processing circuit is configured to output the supplying voltage or the detection signal according to a voltage at a source terminal of the normally-on switching device.

6 Claims, 9 Drawing Sheets

(51) Int. Cl.
*H03K 5/24* (2006.01)
*H02M 1/42* (2007.01)
*H02M 7/5387* (2007.01)
*H02M 1/08* (2006.01)
*H02M 1/32* (2007.01)
*H02M 1/00* (2006.01)

(52) U.S. Cl.
CPC ....... *H02M 1/4208* (2013.01); *H02M 1/4233* (2013.01); *H02M 3/33569* (2013.01); *H02M 3/33592* (2013.01); *H02M 7/5387* (2013.01); *H03K 5/24* (2013.01); *H02M 1/4225* (2013.01); *H02M 2001/0006* (2013.01); *H02M 2001/0058* (2013.01); *H03K 2017/6875* (2013.01)

(58) Field of Classification Search
CPC ........ H02M 7/217; H02M 7/219; H02M 7/44; H02M 7/483; H02M 7/5387; H02M 1/143; H02M 2001/0054; H02M 2001/344; H02M 2001/346; H02M 2001/348; H02M 2007/4811; H02M 2007/4815; H02M 3/145; H02M 3/156; H02M 3/33561; H02M 7/062; H02M 7/1623; H02M 7/7575; H02M 1/00; H02M 1/12; H02M 1/15; H02M 1/4233; H02M 1/4288; H02M 2001/0019; H02M 2001/0022; H02M 2001/0035; H02M 2001/0074; H02M 2001/0077; H02M 2001/123; H02M 2001/325; H02M 2003/1555; H02M 2003/1586; H02M 2007/2195; H02M 2007/4822; H02M 2007/4835; H02M 3/00; H02M 3/005; H02M 3/04; H02M 3/157; H02M 3/1584; H02M 3/337; H02M 3/3378; H02M 5/225; H02M 5/458; H02M 7/08; H02M 7/162; H02M 7/2176; H02M 7/4807; H02M 7/49; H02M 7/537; H02M 7/797; G01R 31/40; G01R 19/00; G01R 19/0084; G01R 19/0092; G01R 31/3272; G01R 31/42; H03K 2217/009; H03K 5/24; H03K 17/105; H03K 17/13; H03K 17/136; H03K 17/16; H03K 17/166; H03K 17/167; H03K 17/602; H03K 17/687; H03K 17/6871; H03K 17/691; H03K 2017/6875; H03K 2217/0036; H03K 2217/0081

See application file for complete search history.

(56) References Cited

U.S. PATENT DOCUMENTS

| | | | |
|---|---|---|---|
| 8,400,143 | B2 * | 3/2013 | Kurumado ............ G01D 5/2451 324/207.25 |
| 8,988,838 | B2 * | 3/2015 | Har-Shai ................ G08B 13/14 361/42 |
| 9,235,228 | B2 * | 1/2016 | Gazit ........................ G05F 3/08 |
| 10,141,740 | B2 * | 11/2018 | Hu ............................ H02J 1/00 |
| 2015/0326212 | A1 | 11/2015 | Boisseau et al. |
| 2018/0024170 | A1 * | 1/2018 | Masuda ............... H03K 3/0233 324/123 R |

FOREIGN PATENT DOCUMENTS

| | | |
|---|---|---|
| CN | 104300010 A | 1/2015 |
| CN | 105009430 A | 10/2015 |
| CN | 105375796 A | 3/2016 |
| CN | 105976781 A | 9/2016 |
| CN | 106452025 A | 2/2017 |
| CN | 206743111 U | 12/2017 |
| TW | 201419742 A | 5/2014 |
| TW | 201508917 A | 3/2015 |

* cited by examiner

AUXILIARY CIRCUIT AND POWER CONVERTER

CROSS-REFERENCE TO RELATED APPLICATION

This application claims priority to U.S. Provisional Application Ser. No. 62/623,746, filed Jan. 30, 2018, which is herein incorporated by reference.

BACKGROUND

Technical Field

The present disclosure relates to a power converter, and in particular, to the power converter with an auxiliary circuit.

Description of Related Art

For existing power converters, additional auxiliary power supplying circuits are designed to provide the electricity required by the control unit of the power converter.

However, the complexity of the additional auxiliary power supplying circuit causes high cost and results in undesired parasitic effect of the circuits, which reduces the quality of the power outputted by the power converter, or even results malfunction of latter load circuit.

SUMMARY

One aspect of the present disclosure is an auxiliary circuit for outputting a supplying voltage or a detection signal. The auxiliary circuit includes a normally-on device and a signal processing circuit. A drain terminal of the normally-on switching device is coupled to a first terminal. A gate terminal of the normally-on switching device is coupled to a second terminal. An input voltage between the first terminal and the second terminal switches between two different levels. The signal processing circuit is configured to output the supplying voltage or the detection signal according to a voltage at a source terminal of the normally-on switching device.

Yet another aspect of the present disclosure is a power converter. The power converter includes a switching circuit, a control circuit, a normally-on switching device, and a signal processing circuit. The switching circuit includes a plurality of switches configured to turn on or off selectively according to a plurality of control signals correspondingly. The control circuit is configured to output the plurality of control signals. A drain terminal of the normally-on switching device is coupled to a drain terminal of one of the switches. A gate terminal of the normally-on switching device is coupled to a source terminal of the one of the switches. The signal processing circuit is electrically coupled to a source terminal of the normally-on switching device, and configured to output an output signal to the control circuit according to a voltage at the source terminal of the normally-on switching device. The switching circuit includes a first switch configured to turn on or off selectively according to control signals correspondingly. The control circuit is configured to output the plurality of control signals. A drain terminal of the normally-on switching device is coupled to a drain terminal of the first switch, and a gate terminal of the normally-on switching device is coupled to a source terminal of the first switch. The signal processing circuit is electrically coupled to a source terminal of the normally-on switching device, and configured to output a supplying voltage or a detection signal to the control circuit according to a voltage at the source terminal of the normally-on switching device. Any one or any combinations of the switching circuit, the control circuit, the normally-on switching device and the signal processing circuit are integrated or packaged together.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
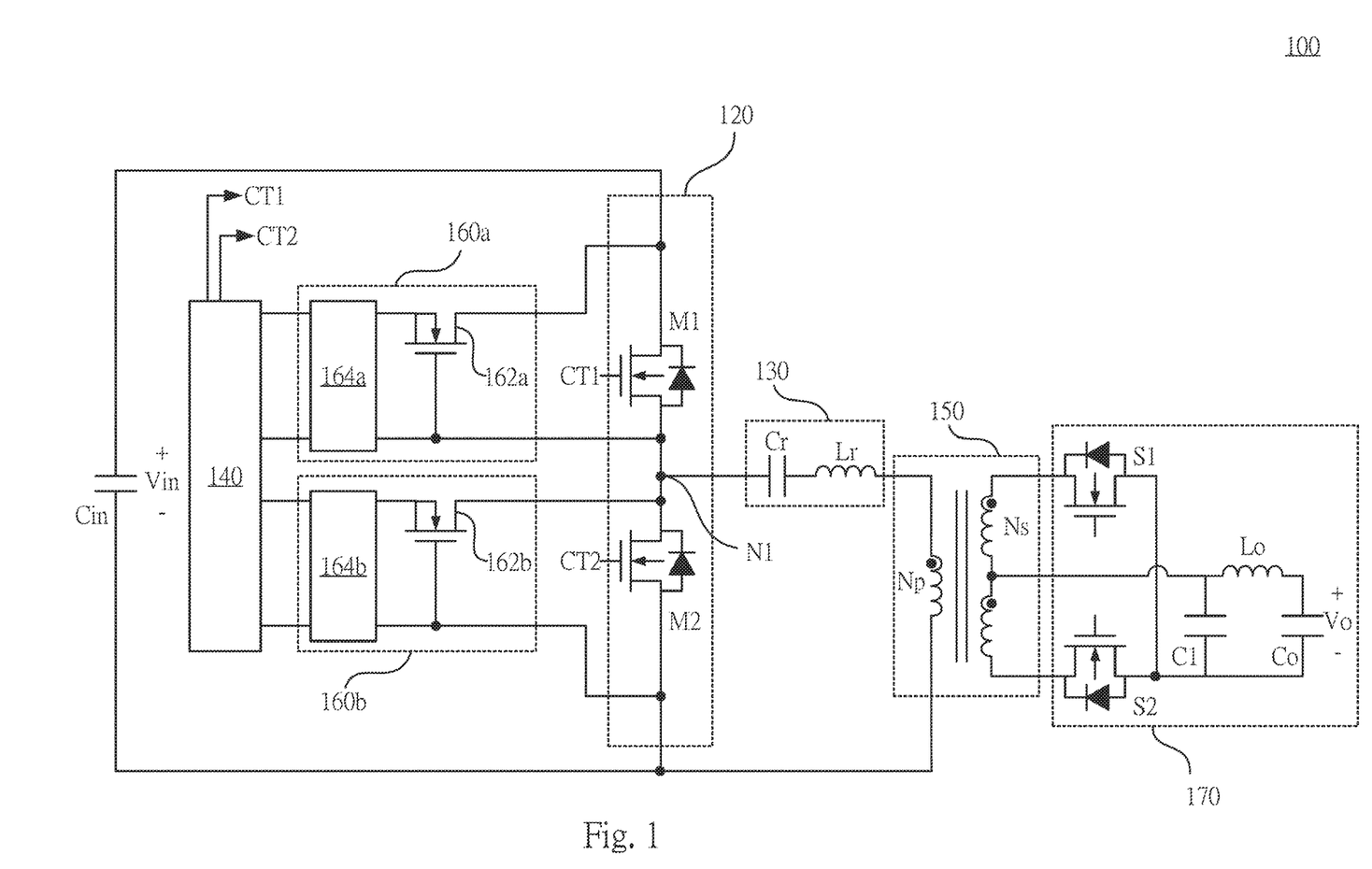
FIG. 1 is a diagram illustrating a power converter 100 according to some embodiments of the present disclosure.

Reference is made to FIG. 1. FIG. 1 is a diagram illustrating a power converter 100 according to some embodiments of the present disclosure. The power converter 100 is configured to convert an input voltage Vin to an output voltage Vo. As shown in FIG. 1, in some embodiments the power converter 100 includes a LLC converter, which includes a switching circuit 120, a resonant circuit 130, a control circuit 140, a transformer 150, auxiliary circuits 160a and 160b, a rectifying circuit 170 and an input capacitor unit Cin and an output capacitor unit Co and configured to convert the input voltage Vin across the input capacitor unit Cin to the output voltage Vo across the output capacitor unit Co, in order to provide the output voltage Vo to a later-stage circuit, for example, a load.

The switching circuit 120 includes a plurality of switches M1 and M2. The switches M1 and M2 are electrically coupled to each other at a node N1 and configured to be on or off selectively according to a plurality of control signals CT1 and CT2 correspondingly. As shown in the drawing, in some embodiments, the switching circuit 120 may be a single-phase half-bridge circuit, but the present disclosure is not limited thereto. In some embodiments, the switches M1 and M2 may be enhanced mode field-effect transistors, such as enhanced mode GaN transistors. For example, the turn-on resistance of the switches M1 and M2 may be within 0.1 m ohm to 1 k ohm.

The control circuit 140 is configured to output the control signals CT1 and CT2. In some embodiments, the control circuit 140 may be implemented by a controller or other suitable driving circuits to output the control signals CT1 and CT2 to control the switches M1 and M2. As shown in FIG. 1, in structural, the auxiliary circuits 160a and 160b are coupled between the switching circuit 120 and the control circuit 140. Specifically, the auxiliary circuits 160a and 160b respectively include normally-on switching devices 162a, 162b and signal processing circuits 164a, 164b. In some embodiments, normally-on switching devices 162a, 162b may be realized by depletion mode GaN transistors, but the present disclosure is not limited thereto. One skilled in the art may apply other proper electronic elements to achieve the normally-on switching devices 162a, 162b. For example, the turn-on resistance of the normally-on switching devices 162a, 162b may be within 1 m ohm to 10 k ohm.

As shown in drawing, a drain terminal of the normally-on switching devices 162a, 162b is coupled to a drain terminal of the corresponding one of the switches M1, M2. A gate terminal of the normally-on switching devices 162a, 162b is coupled to a source terminal of the corresponding one of the switches M1, M2. The signal processing circuits 164a, 164b are respectively electrically coupled to a source terminal of the normally-on switching devices 162a, 162b, and configured to output corresponding output signals to the control circuit 140 according to a voltage at the source terminal of the normally-on switching devices 162a, 162b. For better understanding of the present disclosure, the operation of the auxiliary circuits 160a and 160b will be discussed in following paragraphs with accompanying drawings.

In structural, the input capacitor unit Cin is coupled to switches M1 and M2, and configured to receive the input voltage Vin with a DC level. The resonant circuit 130 is coupled between the node N1 and a primary winding Np of the transformer 150. In some embodiments, the resonant circuit 130 includes a resonant capacitor unit Cr and a resonant inductor unit Lr.

At the secondary side, the rectifying circuit 170 is coupled to a secondary winding Ns of the transformer 150 and configured to rectify and/or filter the voltage across the secondary winding Ns in order to output the output voltage Vo. For example, in some embodiments, the rectifying circuit 170 includes transistors S1 and S2, a capacitor unit C1, an output inductor unit Lo and the output capacitor unit Co. A first terminal of the transistor S1 is coupled to a first terminal of the secondary winding Ns. A first terminal of the transistor S2 is coupled to a second terminal of the secondary winding Ns. A first terminal of the capacitor unit C1 is coupled to a center-tapped terminal of the secondary winding Ns and a first terminal of the output inductor unit Lo. A second terminal of the output inductor unit Lo is coupled to a first terminal of the output capacitor unit Co. A second terminal of the transistor S1 and a second terminal of the transistor S2 are coupled to each other at a second terminal of the capacitor unit C1 and a second terminal of the output capacitor unit Co.

It is noted that various modification may be made to the rectifying circuit 170, and thus the rectifying circuit 170 shown in FIG. 1 is merely an example and not meant to limit the present disclosure.

Accordingly, the control circuit 140 may be configured to output the control signals CT1 and CT2 to selectively turn on or turn off the switches M1 and M2 in the switching circuit 120. Accordingly, the switching circuit 120 may output a switching signal flowing through the resonant circuit 130 and the primary winding Np, in order to transfer the power to the secondary winding Ns and output the power via the rectifying circuit 170. Thus, the operation of LLC converter is achieved.

Figure 2A:
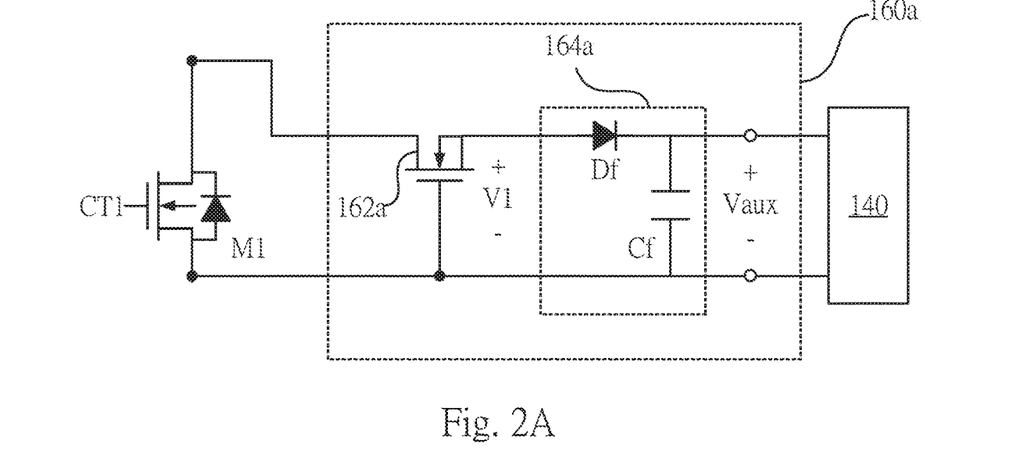
FIG. 2A-FIG. 2C are diagrams illustrating the auxiliary circuit 160a according to some embodiments of the present disclosure.
Figure 2B:
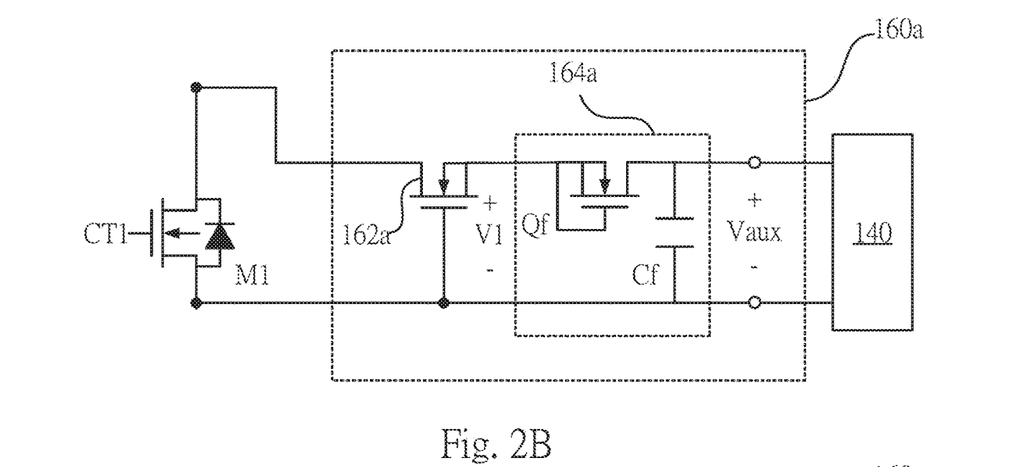
Figure 2C:
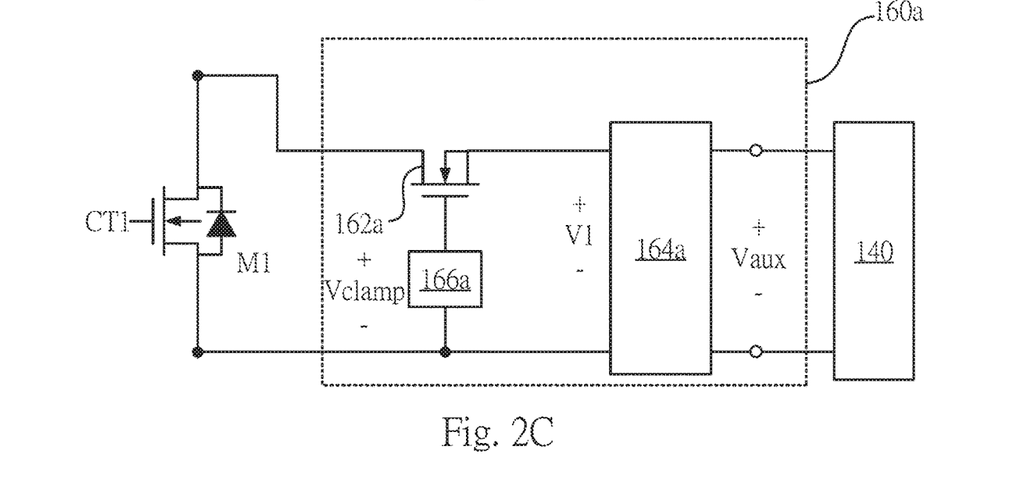

Reference is made to FIG. 2A-FIG. 2C. FIG. 2A-FIG. 2C are diagrams illustrating the auxiliary circuit 160a according to some embodiments of the present disclosure. As shown in FIG. 2A-FIG. 2C, in some embodiments, the auxiliary circuit 160a may be used as a supplying circuit configured to provide an auxiliary supplying voltage Vaux for the control circuit 140.

As shown in FIG. 2A-FIG. 2C, in some embodiments, the signal processing circuit 164a may be a filtering circuit configured to filter a first voltage V1 across a source terminal of the normally-on switching device 162a and the source terminal of the first switch M1, and output the supplying voltage Vaux correspondingly.

Specifically, in the embodiment of FIG. 2A, the filtering circuit includes a diode unit Df and a filtering capacitor unit Cf. In structural, an anode of the diode unit Df is coupled to the source terminal of the normally-on switching device 162a, a cathode of the diode unit Df is coupled to a first terminal of the filtering capacitor unit Cf, and a second terminal of the filtering capacitor unit Cf is coupled to the source terminal of the first switch M1.

In some other embodiments, as shown in FIG. 2B, the filtering circuit includes a transistor unit Qf and a filtering capacitor unit Cf. In structural, a source terminal of the transistor unit Qf is coupled to a gate terminal of the transistor unit Qf and the source terminal of the normally-on switching device 162a, a drain terminal of the transistor unit Qf is coupled to a first terminal of the filtering capacitor unit Cf, and a second terminal of the filtering capacitor unit Cf is coupled to the source terminal of the first switch M1.

Thus, by the operation of the signal processing circuit 164a, the filtered supplying voltage Vaux may be outputted to the control circuit 140 to provide the power required by the control circuit 140.

In addition, in some embodiments, the magnitude of voltage V1 may be greater than the threshold voltage of normally-on switching device 162a. In order to prevent mis-operation of the normally-on switching device 162a, the auxiliary circuit 160a may further include a clamping circuit 166a. The clamping circuit 166a is electrically coupled between the gate terminal of the normally-on switching device 162a and the source terminal of the first switch M1, and configured to clamp a clamping voltage Vclamp across two terminals of the clamping circuit 166a. Thus, the transistors elements with various threshold voltages may be chosen to achieve the normally-on switching device 162a, by designing proper clamping voltage Vclamp to avoid the mis-operation of the normally-on switching device 162a while the first voltages V1 is high.

Figure 3A:
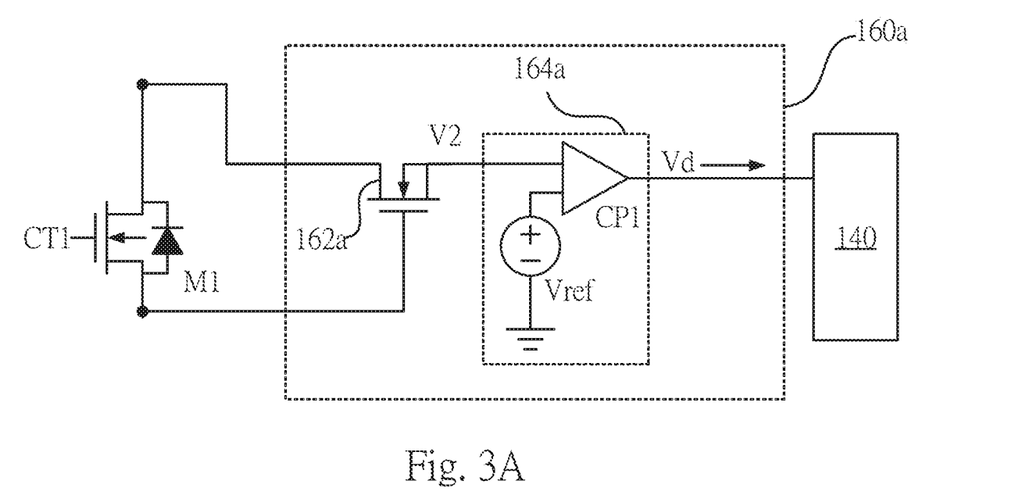
FIG. 3A and FIG. 3B are diagrams illustrating the auxiliary circuit 160a according to some other embodiments of the present disclosure.
Figure 3B:
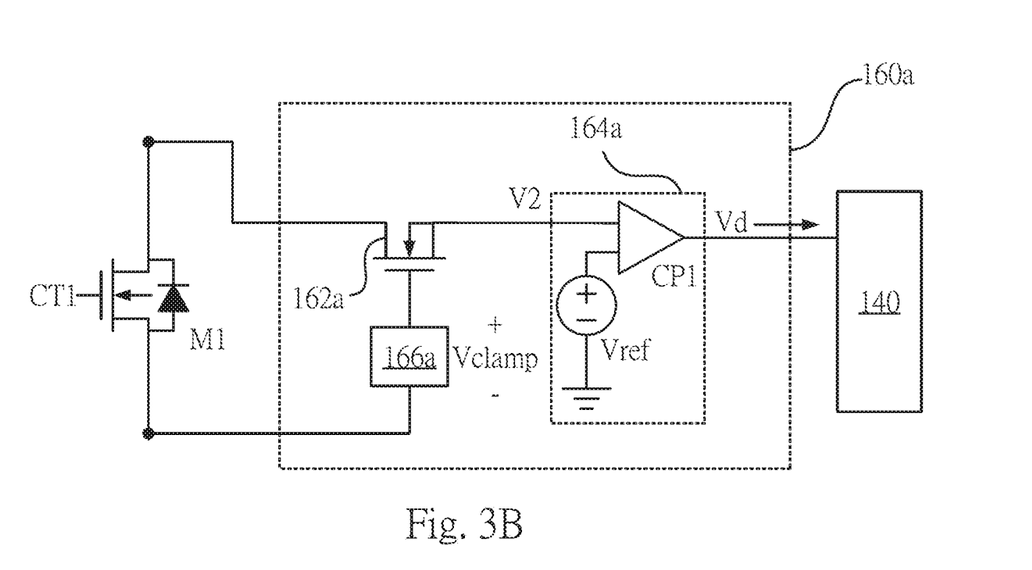

Reference is made to FIG. 3A and FIG. 3B. FIG. 3A and FIG. 3B are diagrams illustrating the auxiliary circuit 160a according to some other embodiments of the present disclosure. As shown in FIG. 3A and FIG. 3B, in some embodiments, the auxiliary circuit 160a may be used as a detecting circuit configured to provide a desaturation detection signal Vd for the control circuit 140.

As shown in FIG. 3A and FIG. 3B, in some embodiments, the signal processing circuit 164a electrically coupled to the source terminal of the normally-on switching device 162a may be a logic circuit. The logic circuit is configured to output a desaturation detection Vd signal according to the voltage V2 at the source terminal of the normally-on switching device 162a and a reference voltage Vref.

Specifically, in FIG. 3A, the logic circuit includes a comparator unit CP1. A first input terminal of the comparator unit CP1 is coupled to the source terminal of the normally-on switching device 162a, a second input terminal of the comparator unit CP1 is coupled to a reference voltage source to receive the reference voltage Vref, and an output terminal of the comparator unit CP1 is configured to output the desaturation detection signal Vd. The desaturation detection signal Vd indicates whether a misoperation occurs in the switch M1.

Accordingly, on the condition that a misoperation occurs in the switch M1, an abnormal drain-to-source voltage of the switch M1 may be detected. For example, if the voltage at the source terminal of the normally-on switching device 162a is higher than the reference voltage Vref, the comparator unit CP1 may output the corresponding desaturation detection signal Vd with high level to the control signal in order to warn the mis-operation occurs and perform corresponding protection.

Similarly, as shown in FIG. 3B, in some embodiments, the magnitude of voltage V2 may be greater than the threshold voltage of normally-on switching device 162a. In order to prevent mis-operation of the normally-on switching device 162a, the auxiliary circuit 160a may further include a clamping circuit 166a. The clamping circuit 166a is electrically coupled between the gate terminal of the normally-on switching device 162a and the source terminal of the first switch M1, and configured to clamp a clamping voltage Vclamp across two terminals of the clamping circuit 166a. Thus, the transistors elements with various threshold voltages may be chosen to achieve the normally-on switching device 162a, by designing proper clamping voltage Vclamp to avoid the mis-operation of the normally-on switching device 162a while the voltage V2 at the source terminal of the normally-on switching device 162a is high.

Figure 4:
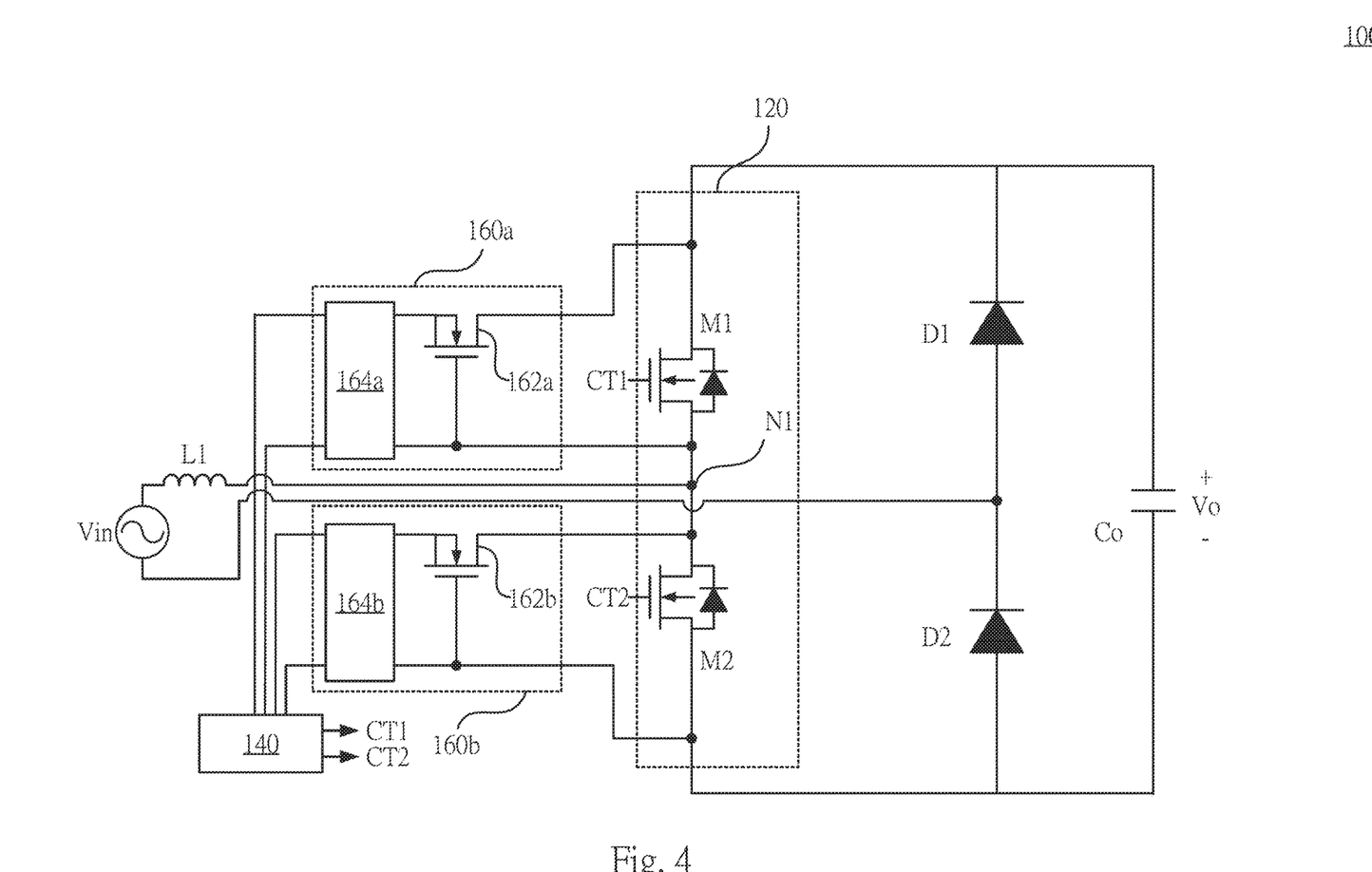
FIG. 4 is a diagram illustrating the power converter 100 according to some other embodiments of the present disclosure.

In addition, the detecting circuit and/or the supplying circuit shown in the above embodiments may also be applied in various types of power converters/inverters. Reference is made to FIG. 4. FIG. 4 is a diagram illustrating the power converter 100 according to some other embodiments of the present disclosure. With respect to the embodiments of FIG. 4, like elements in FIG. 1 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

Compared to FIG. 1, in the embodiments of FIG. 4, the power converter 100 may include a totem-pole power factor correction circuit, in which the totem-pole power factor correction circuit includes a first inductor unit L1 coupled to the node N1, a first diode unit D1, a second diode unit D2, and the output capacitor unit Co. The totem-pole power factor correction circuit may be configured to convert the AC input voltage Vin to the DC output voltage across the capacitor unit Co and achieve power factor correction by controlling on and off of the switches M1 and M2.

As shown in drawing, a cathode of the first diode unit D1 is coupled to a drain terminal of the switch M1. A cathode of the second diode unit D2 is coupled to an anode of the first diode unit D1, and an anode of the second diode unit D2 is coupled to a source terminal of the switch M2. The output capacitor unit Co is coupled between the cathode of the first diode unit D1 and the anode of the second diode unit D2. One skilled in the art can understand the operation of the totem-pole power factor correction circuit and thus further explanation is omitted herein for the sake of brevity.

Figure 5A:
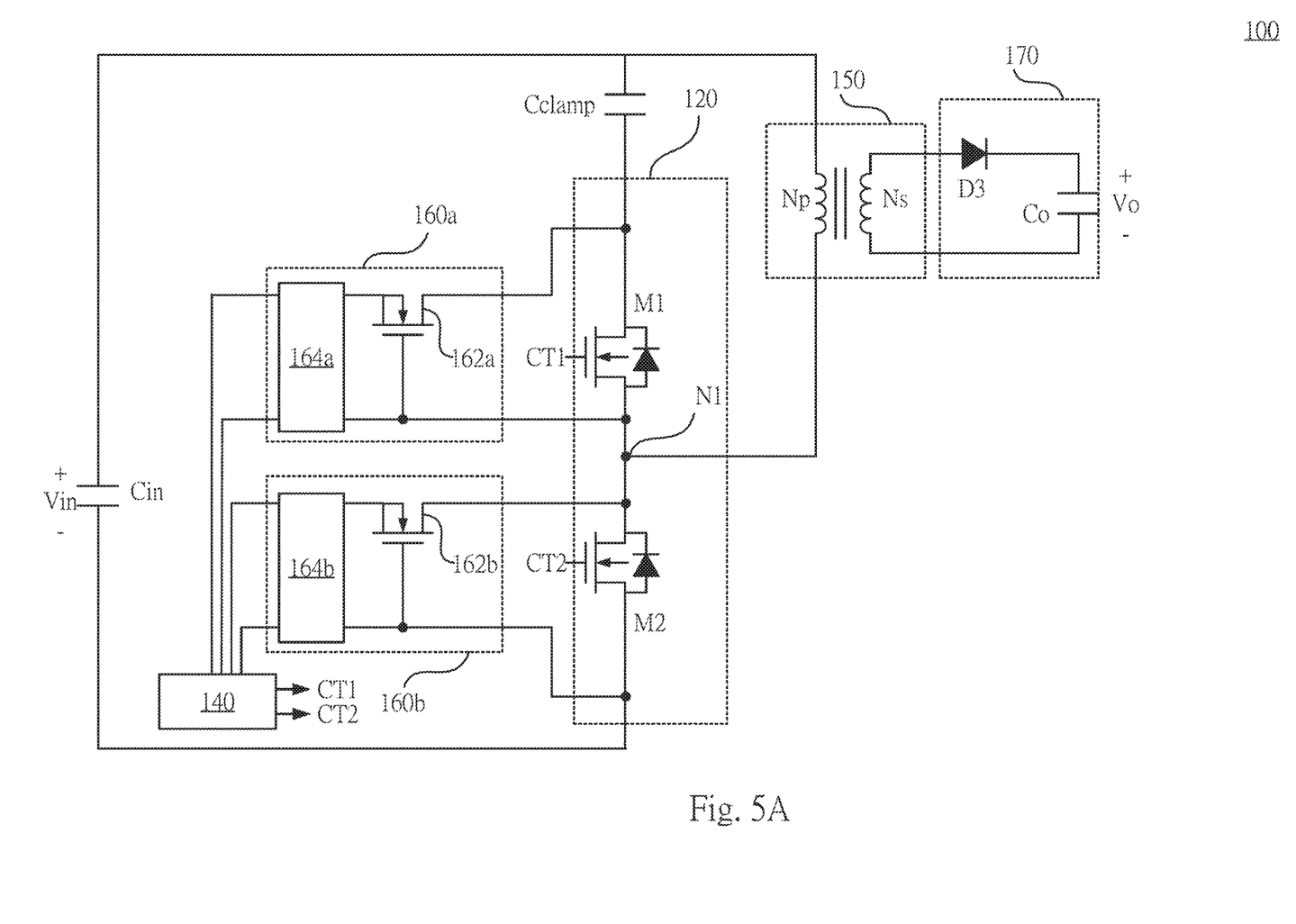
FIG. 5A and FIG. 5B are diagrams illustrating the power converter 100 according to some other embodiments of the present disclosure.
Figure 5B:
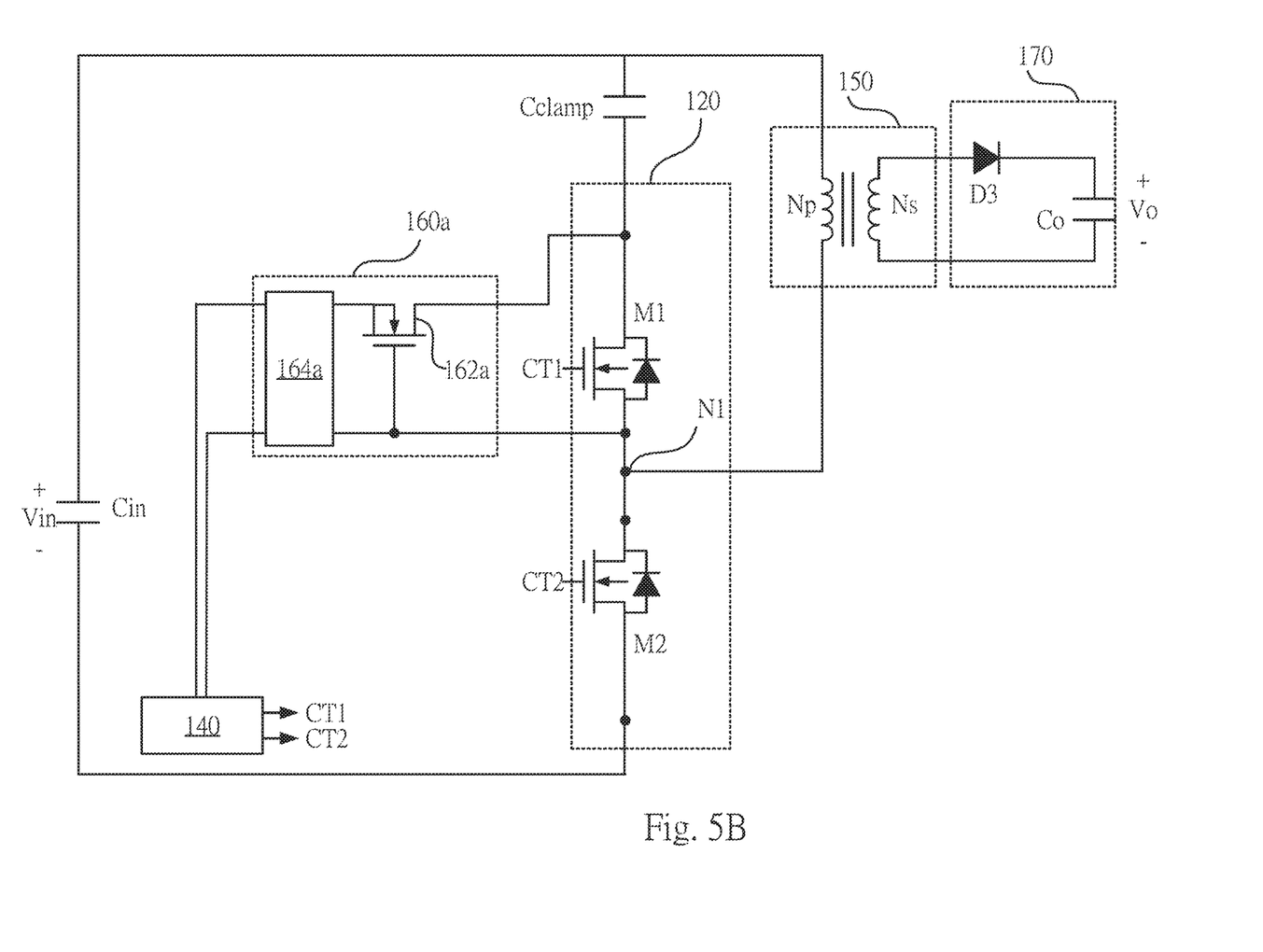

Reference is made to FIG. 5A and FIG. 5B. FIG. 5A and FIG. 5B are diagrams illustrating the power converter 100 according to some other embodiments of the present disclosure. With respect to the embodiments of FIG. 5A and FIG. 5B, like elements in FIG. 1-4 are designated with the same reference numbers for ease of understanding.

In the embodiments of FIG. 5A and FIG. 5B, the power converter 100 may include a fly-back converter which includes the transformer 150, a clamping capacitor Cclamp, and the rectifying circuit 170.

As shown in the drawing, a first terminal of the primary winding Np of the transformer 150 is coupled to the node N1. The clamping capacitor Cclamp is coupled between a second terminal of the primary winding Np of the transformer 150 and the drain terminal of the switch M1. At the secondary side, the rectifying circuit 170 is coupled to a secondary winding Ns of the transformer 150. In some embodiments, the rectifying circuit 170 includes a rectifying diode D3 and the output capacitor unit Co, in which an anode of the rectifying diode D3 is coupled to the secondary winding Ns, and a cathode of the rectifying diode D3 is coupled to the output capacitor unit Co. It is noted that the DC-DC fly-back converter may be achieved in various configurations and thus FIG. 5A and FIG. 5B are merely examples and not meant to limit the present disclosure.

In addition, in some embodiments, as shown in FIG. 5A, the auxiliary circuits 160a and 160b may be coupled to the switches M1 and M2 respectively to provide supplying voltages and/or detecting signals. In some other embodiments, as shown in FIG. 5B, the power converter 100 may also include one auxiliary circuit 160a coupling to the switch M1 to provide supplying voltages and/or detecting signals for actual needs. Alternatively stated, it is possible that only one or some of the auxiliary circuits 160a and 160b are arranged to be coupled to the switches M1, M2.

Figure 6:
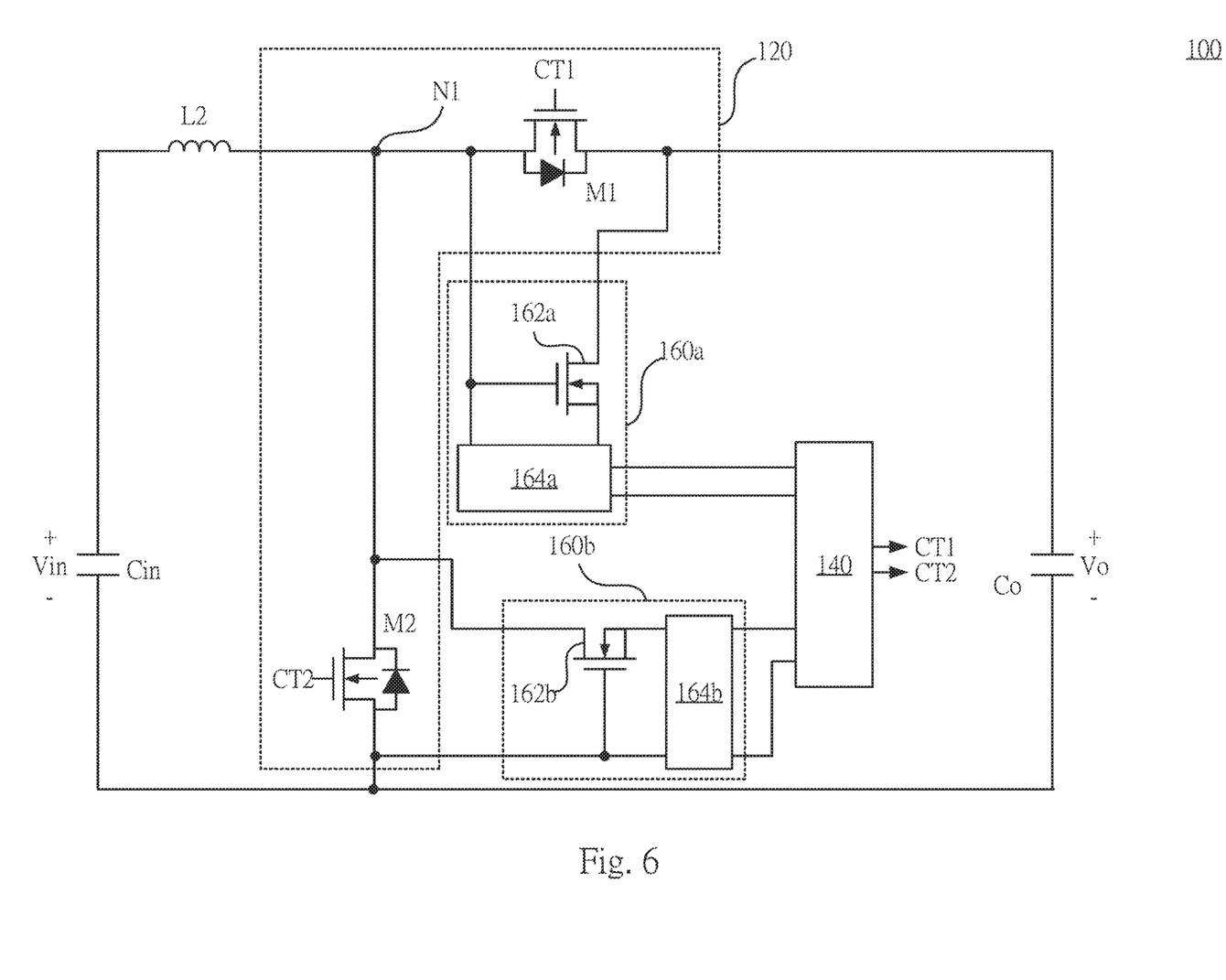
FIG. 6 is a diagram illustrating the power converter 100 according to some other embodiments of the present disclosure.

Reference is made to FIG. 6. FIG. 6 is a diagram illustrating the power converter 100 according to some other embodiments of the present disclosure. With respect to the embodiments of FIG. 6, like elements in FIG. 1-5 are designated with the same reference numbers for ease of understanding.

In the embodiments of FIG. 6, the power converter 100 may include a buck-boost converter which includes the input capacitor unit Cin, an inductor unit L2, and the output capacitor unit Co. The input capacitor unit is electrically coupled to the source terminal of the switch M2. The inductor unit L2 is electrically coupled between the input capacitor unit Cin and the node N1. The output capacitor unit Co is electrically coupled between the drain terminal of the switch M1 and the source terminal of the switch M2. Similarly, various modifications may be made to achieve the buck-boost converter, and the present disclosure is not limited thereto.

Figure 7:
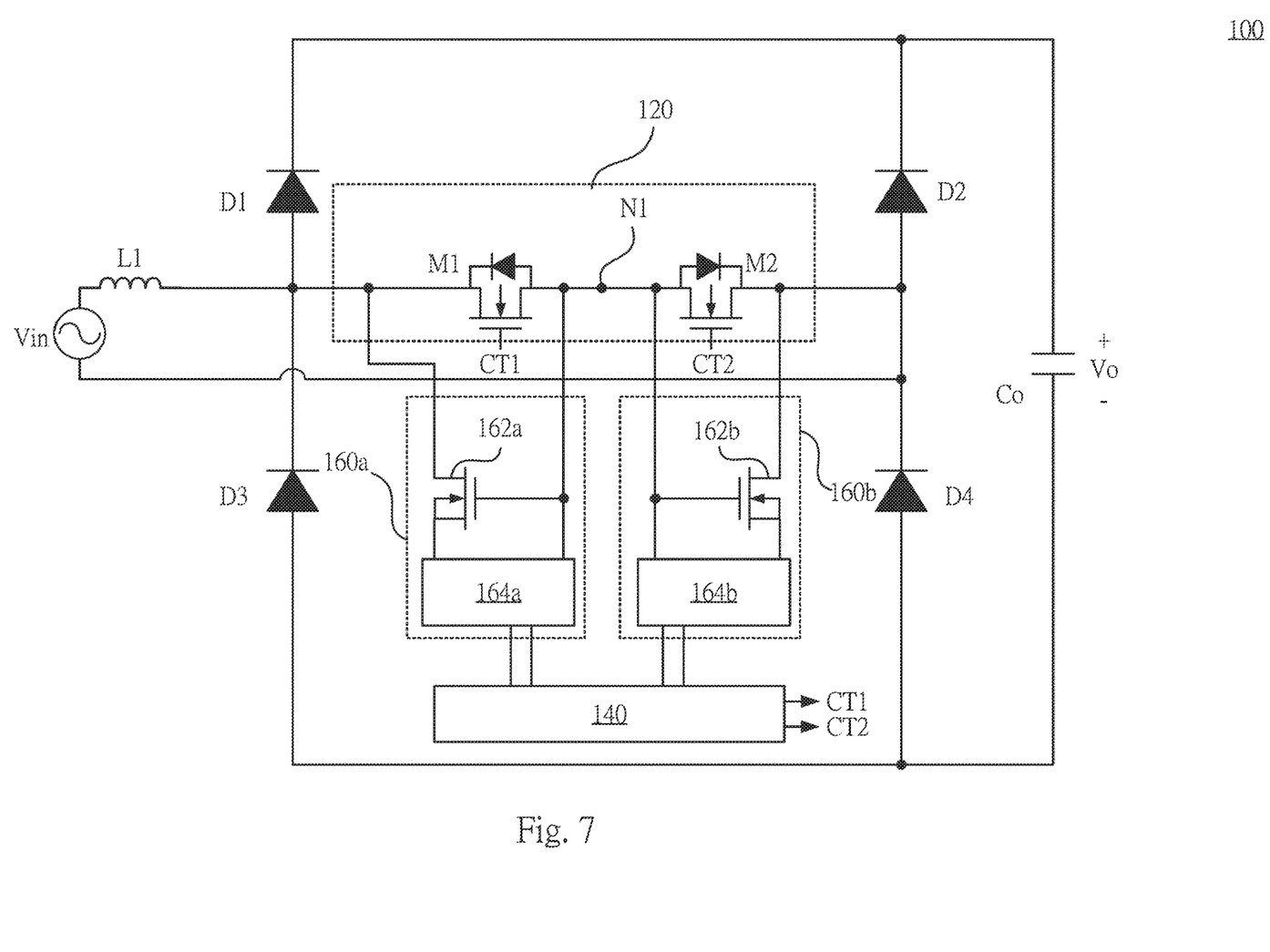
FIG. 7 is a diagram illustrating the power converter 100 according to some other embodiments of the present disclosure.

In addition, in some embodiments, the switching circuit 120 may be applied by symmetrical half bridge topology to implement a symmetrical half bridge converter. Alternatively stated, in some embodiments, the source terminals of the switches M1 and M2 may be coupled together at the node N1. Reference is made to FIG. 7. FIG. 7 is a diagram illustrating the power converter 100 according to some other embodiments of the present disclosure.

With respect to the embodiments of FIG. 7, like elements in FIG. 1-6 are designated with the same reference numbers for ease of understanding.

In the embodiments of FIG. 7, the power converter 100 may include an H-bridge power factor correction circuit, and the source terminals of the switches M1 and M2 may be coupled together at the node N1 to form a symmetrical half bridge topology.

The H-bridge power factor correction circuit includes the inductor unit L1, the output capacitor unit Co, and diodes D1-D4. The inductor unit L1 is electrically coupled the drain terminal of the switch M1. The diode D1 is electrically coupled between the drain terminal of the switch M1 and a first terminal of the output capacitor unit Co. The diode D2 is electrically coupled between the drain terminal of the switch M2 and the first terminal of the output capacitor unit Co. The diode D3 is electrically coupled between the drain terminal of the switch M1 and a second terminal of the output capacitor unit Co. The diode D4 is electrically coupled between the drain terminal of the switch M2 and the second terminal of the output capacitor unit Co.

Accordingly, by the co-operation of the inductor unit L1, the diodes D1-D4, the controlled switches M1 and M2 and the output capacitor unit Co, the power convert 100 may convert the AC input voltage Vin to the DC output voltage Vo, and perform power factor correction to increase the power factor of AC voltage and AC current at the AC side.

Furthermore, in some other embodiments, the switching circuit 120 may also be a multiphase half-bridge circuit. Each phase leg of the switching circuit 120 includes switches M1 and M2 electrically coupled to each other at the node N1 of the phase leg. For example, the switching circuit 120 may be a two phase half-bridge circuit or a three phase half-bridge circuit, in order to be applied in a multiphase system.

Figure 8:
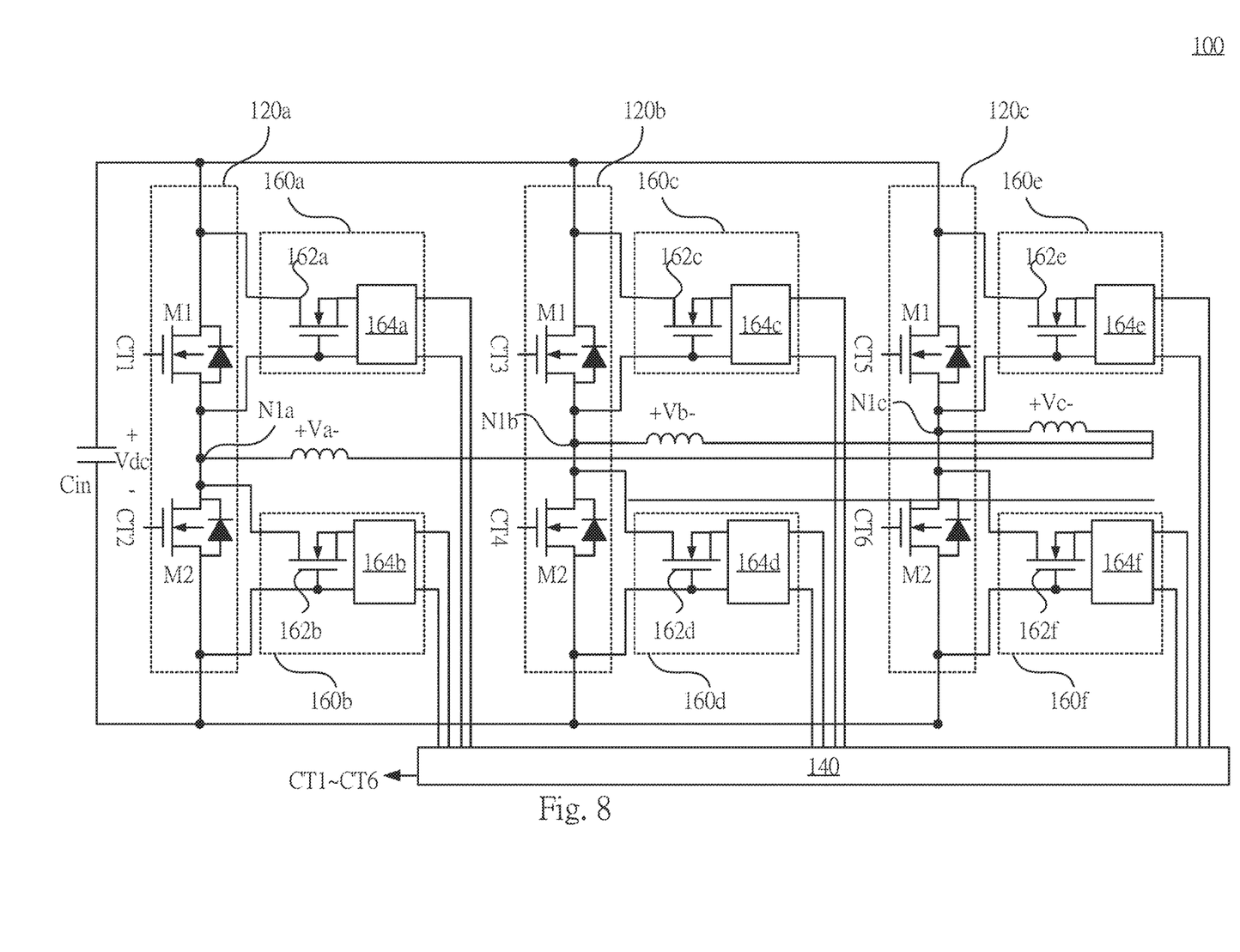
FIG. 8 is a diagram illustrating the power converter 100 according to some other embodiments of the present disclosure.

Reference is made to FIG. 8. FIG. 8 is a diagram illustrating the power converter 100 according to some other embodiments of the present disclosure. With respect to the embodiments of FIG. 8, like elements in FIG. 1-7 are designated with the same reference numbers for ease of understanding.

In the embodiments of FIG. 8, the power converter 100 may include a three phase inverter for a three phase power system. As shown in FIG. 8, the switches M1 in three phase legs 120a, 120b, 120c are coupled to each other at a first dc terminal (e.g., a first terminal of the input capacitor unit Cin). The switches M2 in the three phase legs 120a, 120b, 120c are coupled to each other at a second dc terminal (e.g., a second terminal of the input capacitor unit Cin). The nodes N1a, N1b, N1c of the three phase legs 120a, 120b, 120c are respectively coupled to corresponding ac terminals in order to provide corresponding ac voltages Va, Vb, Vc. Thus, the three phase inverter may achieve power conversion between three phase ac power and dc power by the control signals CT1-CT6 outputted by the control circuit 140.

Specifically, the switches M1 and M2 in three phase legs 120a, 120b, 120c may be on or off according to the corresponding on of the control signals CT1-CT6. Since the operation of the normally-on switching devices 162a-162f, signal processing circuits 164a-164f in the auxiliary circuits 160a-160f are similar to the operation of which in the auxiliary circuits 160a and 160b discussed in the above embodiments, further explanation are omitted herein for the sake of brevity.

It is noted that, in some embodiments, some elements in the power converter 100 of various embodiments mentioned above may be integrated together as a system-in-package (SIP), a system-on-chip, a three-dimensional integrated circuit (3D IC), etc. For example, in some embodiments, the normally-on switching device, the signal processing circuit and the switches M1, M2 may be integrated and packaged together. Alternatively stated, any one or any combinations of the switching circuit, the control circuit, the normally-on switching device and the signal processing circuit in the power converter 100 are integrated or packaged together In addition, the elements in the above embodiments may be implemented by various digital or analog circuits, and may also be implemented by different integrated circuit chips. Each element may also be integrated in a single chip. It is noted that, in an actual implementation, the control circuit may be realized by a microcontroller unit (MCU), or by be realized in various ways such as by a digital signal processor (DSP), a field-programmable gate array (FPGA), etc. The switches and transistors may be realized by proper devices. For example, the switches may be implemented by power semiconductor devices including but not limited to Insulated Gate Bipolar Transistors (IGBTs), bipolar junction transistors (BJTs), SiC metal-oxide-semiconductor field-effect transistors (MOSFET), or mechanical switches, such as various types of relays. The normally-on switching devices may be GaN transistors or semiconductors devices with similar I-V characteristics. Transformer, diodes, resistors, capacitor units and/or inductors units may be realized by suitable electronic elements. The above list is merely exemplary and is not meant to be limitations of the present disclosure.

In summary, in various embodiments of the present disclosure, by arranging the auxiliary circuits between the switches in the power device and the control circuit, an auxiliary power may be provide via the auxiliary circuits. In some other embodiments, the auxiliary circuits may also provide detecting signal to detect malfunction of the switches in the power device. Accordingly, the design of auxiliary power supplying circuit and/or the desaturation detection circuit may be simplified. Therefore, the size of the circuit may be reduced and the cost of manufacture may also be lowered.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure.

Although the disclosure has been described in considerable detail with reference to certain embodiments thereof, it will be understood that the embodiments are not intended to limit the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An auxiliary circuit for outputting a supplying voltage or a detection signal, comprising:
    a normally-on switching device, wherein a drain terminal of the normally-on switching device is coupled to a first terminal, a gate terminal of the normally-on switching device is coupled to a second terminal, wherein an input voltage between the first terminal and the second terminal switches between two different levels; and
    a signal processing circuit configured to process a voltage between a source terminal of the normally-on switching device and the gate terminal of the normally-on switching device, to output the supplying voltage or the detection signal according to the voltage between the source terminal of the normally-on switching device and the gate terminal of the normally-on switching device.

2. The auxiliary circuit of claim 1, wherein the signal processing circuit comprises:
    a filtering circuit configured to filter a first voltage across the source terminal of the normally-on switching device and the second terminal, and output the supplying voltage correspondingly.

3. The auxiliary circuit of claim 2, wherein the filtering circuit comprises a diode unit and a filtering capacitor unit, and an anode of the diode unit is coupled to the source terminal of the normally-on switching device, a cathode of the diode unit is coupled to a first terminal of the filtering capacitor unit, and a second terminal of the filtering capacitor unit is coupled to the second terminal.

4. The auxiliary circuit of claim 2, wherein the filtering circuit comprises a transistor unit and a filtering capacitor unit, and a source terminal of the transistor unit is coupled to a gate terminal of the transistor unit and the source terminal of the normally-on switching device, a drain terminal of the transistor unit is coupled to a first terminal of the filtering capacitor unit, and a second terminal of the filtering capacitor unit is coupled to the second terminal.

5. The auxiliary circuit of claim 1, wherein the normally-on device comprises a depletion mode GaN transistor or a semiconductor device with similar I-V characteristics.

6. The auxiliary circuit of claim 1, wherein the normally-on switching device, and the signal processing circuit are integrated or packaged together.

* * * * *